United States Patent [19]
Koizumi

[11] Patent Number: 5,296,757
[45] Date of Patent: Mar. 22, 1994

[54] LOW-NOISE OUTPUT DRIVER HAVING SEPARATE SUPPLY LINES AND SEQUENCED OPERATION FOR TRANSIENT AND STEADY-STATE PORTIONS

[75] Inventor: Masayuki Koizumi, Yokohama, Japan

[73] Assignee: Kabushiki Kaisha Toshiba, Kawasaki, Japan

[21] Appl. No.: 998,922

[22] Filed: Dec. 30, 1992

[30] Foreign Application Priority Data

Jan. 9, 1992 [JP] Japan ................... 4-002108

[51] Int. Cl.⁵ ................ H03K 19/003; H03K 17/16
[52] U.S. Cl. ................... 307/443; 307/296.1; 307/451; 307/473; 307/475
[58] Field of Search ............... 307/443, 451, 473, 475, 307/263, 591, 594, 296.1, 303.2

[56] References Cited

U.S. PATENT DOCUMENTS

| | | | |
|---|---|---|---|
| 4,656,370 | 4/1987 | Kanuma | 307/443 X |
| 4,829,199 | 5/1989 | Prater | 307/451 X |
| 4,883,978 | 11/1989 | Ohshima et al. | 307/303.2 X |
| 4,918,339 | 4/1990 | Shigeo et al. | 307/263 X |
| 5,049,763 | 9/1991 | Rogers | 307/475 X |
| 5,122,690 | 6/1992 | Bianchi | 307/475 |
| 5,166,555 | 11/1992 | Kano | 307/443 X |

Primary Examiner—David R. Hudspeth
Attorney, Agent, or Firm—Banner, Birch, McKie & Beckett

[57] ABSTRACT

The present invention discloses an output circuit which comprises an input terminal for receiving an input signal having a predetermined logic level, an output terminal held at a potential corresponding to the logic level of the input signal, first and second power sources, separated from each other, third and fourth power sources, separated from each other, a fast potential changing circuit, which is connected between the first and third power sources, for instantaneously changing the potential at said output terminal when a logic level of the input signal changes, potential maintaining circuit connected between said second and fourth power sources, for maintaining the potential of the output terminal at the same level after the potential is changed by the rapid potential changing circuit, a first controlling circuit for controlling the fast potential changing circuit such that the fast potential changing circuit starts operating when the logic level of the input signal changes and stops operating after a predetermined time of period elapses, and a second controlling circuit for controlling the potential maintaining circuit such that the potential maintaining circuit starts operating after the fast potential changing circuit starts operating.

24 Claims, 6 Drawing Sheets

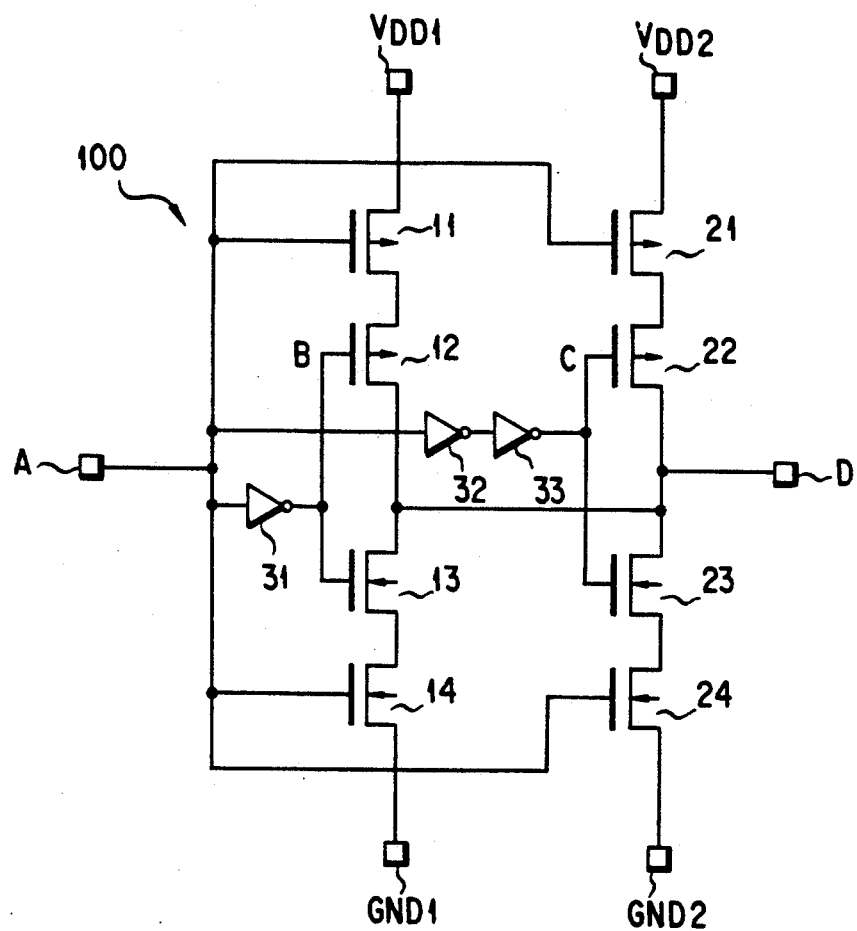
F I G. 4

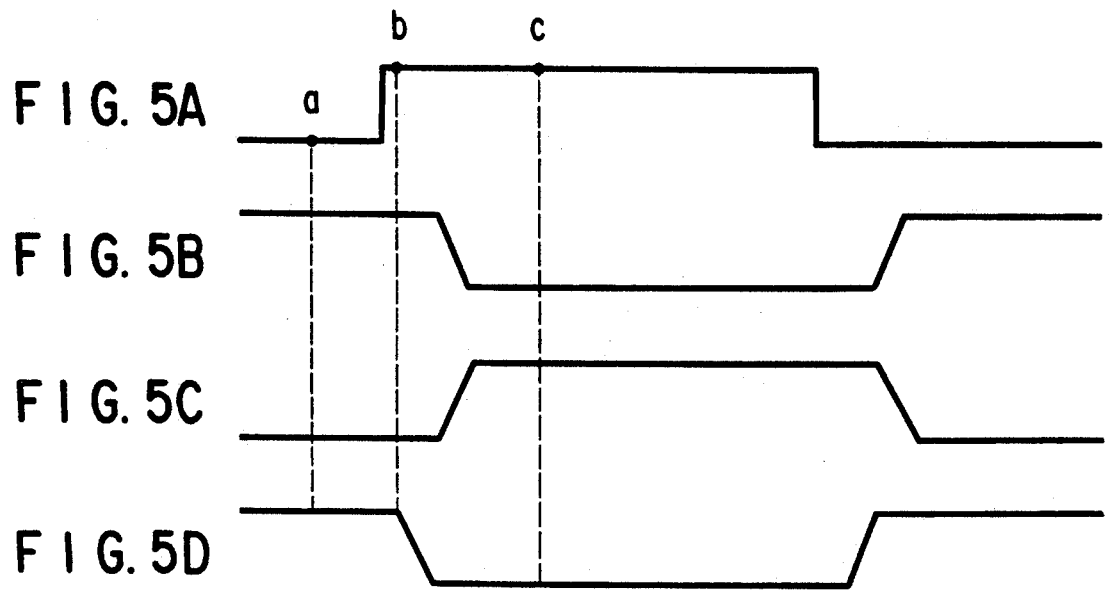
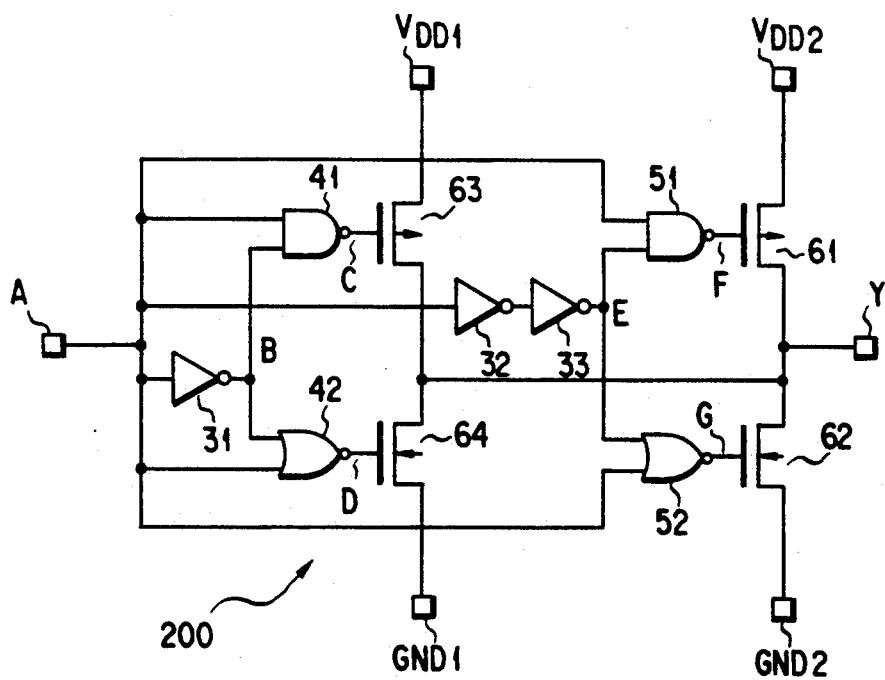
FIG. 6

| A | E | Y |
|---|---|---|
| L | H | L |
| H | H | H |
| X | L | H.Z |

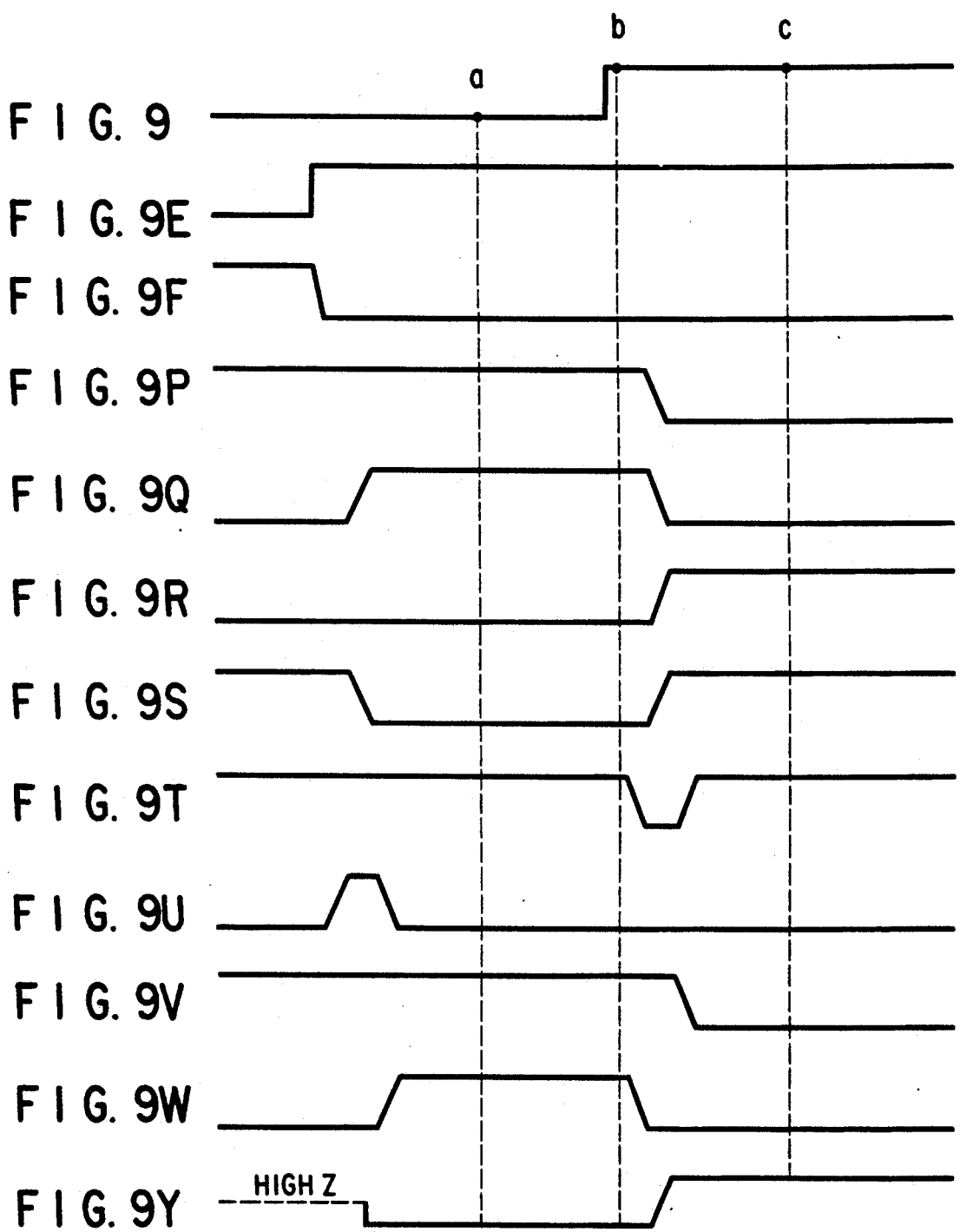

LOW-NOISE OUTPUT DRIVER HAVING SEPARATE SUPPLY LINES AND SEQUENCED OPERATION FOR TRANSIENT AND STEADY-STATE PORTIONS

BACKGROUND OF THE INVENTION

1. Field of the Invention

This invention relates to an output circuit placed at the output stage of a semiconductor integrated circuit, and more particularly to an output circuit for use in a semiconductor integrated circuit required to operate at high speeds and to be immune to switching noises.

2. Description of the Related Art

Referring to the accompanying drawings, conventional output circuits will be explained hereinafter.

FIG. 1 is a block diagram of a plurality of output circuits placed in a semiconductor integrated circuit.

FIG. 2 is a diagram showing a construction of the output circuit of FIG. 1, and FIG. 3 is a diagram showing another construction of the FIG. 1 circuit.

As shown in FIG. 1, a semiconductor integrated circuit usually has a plurality of output circuits 8. When a plurality of input signals supplied to the output circuits 8 change in phase with each other, a large current will flow through a power supply line 9 or 6 to drive the loads connected (not shown) to the output circuits 8. Since inductance is parasitic on each of the terminals, bonding wires, frame, and others of the semiconductor integrated circuit, a large current flowing through the power supply line 9 or 6 causes the power supply potential to fluctuate. This results in the problem that noise occurs in the output signal of an output circuit 8 whose input signal remains unchanged or that the semiconductor integrated circuit malfunctions.

This problem will be described in more detail, referring the output circuit 8a of FIG. 2. When the input signal supplied to the input terminal A rises from a low to a high level, the p-channel MOSFET 1 will turn off, and the n-channel MOSFET 2 will turn on. As a result, current flows from the load (not shown) connected to the output terminal B to the ground terminal GND3, causing the output signal from the output terminal B to change from a high to a low level. At this time, the current flowing through the ground terminal GND3 causes the potential at the ground terminal GND3 to fluctuate, creating switching noises Conventionally, to reduce switching noises in such an output circuit, an adverse effect of the inductance parasitic on the power supply terminals are alleviated by slowing the turn-on speed of the output transistors to suppress changes in the current flowing through the power supply lines.

With the method of slowing the turn-on speed of the output transistors, however, there arises the problem that the semiconductor integrated circuit operates at lower speeds because a change of the output signal potential is slower than that of the input signal potential.

SUMMARY OF THE INVENTION

Accordingly, an object of the present invention is to provide an output circuit that is immune to switching noises and operates at high speeds.

The output circuit placed at the output stage of a semiconductor circuit is characterized by comprising: a holding circuit composed of a first switch circuit one end of whose current path is supplied with a first power supply voltage and the other end of whose current path is connected to the output terminal of the output circuit, and a second switch circuit one end of whose current path is connected to the output terminal and the other end of whose current path is supplied with a second voltage; a hold control circuit for supplying control signals to the control electrodes of the first and second switch circuits to control the holding circuit; a driving circuit composed of a third switch circuit one end of whose current path is supplied with a third voltage and the other end of whose current path is connected to the output terminal, and a fourth switch circuit one end of whose current path is connected to the output terminal and the other end of whose current path is supplied with a fourth voltage; and a drive control circuit for supplying control signals to the control electrodes of the third and fourth switch circuits to control the driving circuit; wherein the holding circuit maintains the output potential of the output circuit when the input signal potential is constant, whereas the driving circuit actuates the load connected to the output terminal when the input signal potential is in transition.

With the above-mentioned arrangement, for example, the first and third voltages are set at the power supply voltage, and the second and fourth voltages at the ground voltage. When the input signal supplied to the output circuit is constant, the hold control circuit controls the operation of the holding circuit so that the first or second voltage signal supplied to the holding circuit may be supplied to the load connected to the output terminal.

When the input signal is in transition, the drive control circuit controls the driving circuit so that the third or fourth voltage signal supplied to the holding circuit may be supplied to the load connected to the output terminal. Because of this, the third and fourth voltages on the side of the driving circuit fluctuate. The power supply for the driving circuit is separate from that for the holding circuit, so that the first and second voltages do not fluctuate.

After that, when the signal supplied to the output circuit becomes constant, the hold control circuit controls the operation of the holding circuit so that the second or first voltage supplied to the holding circuit may be supplied to the load connected to the output terminal. At this time, the load has been already charged or discharged by the driving circuit, with the result that the first or second voltage does not fluctuate. Consequently, the adjacent other output circuits whose state is stable can avoid the influence of noises caused during the transition.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 4 is a circuit diagram of an output circuit according to a first embodiment of the present invention;

FIGS. 5A to 5D are a timing chart for explaining the operation of the output circuit of the first embodiment;

FIG. 6 is a circuit diagram of an output circuit according to a second embodiment of the present invention;

FIGS. 9, 9E–9F and 9P–9Y are a timing chart for explaining the operation of the output circuit of the third embodiment.

DETAILED DESCRIPTION OF THE PREFERRED EMBODIMENTS

Figure 1:
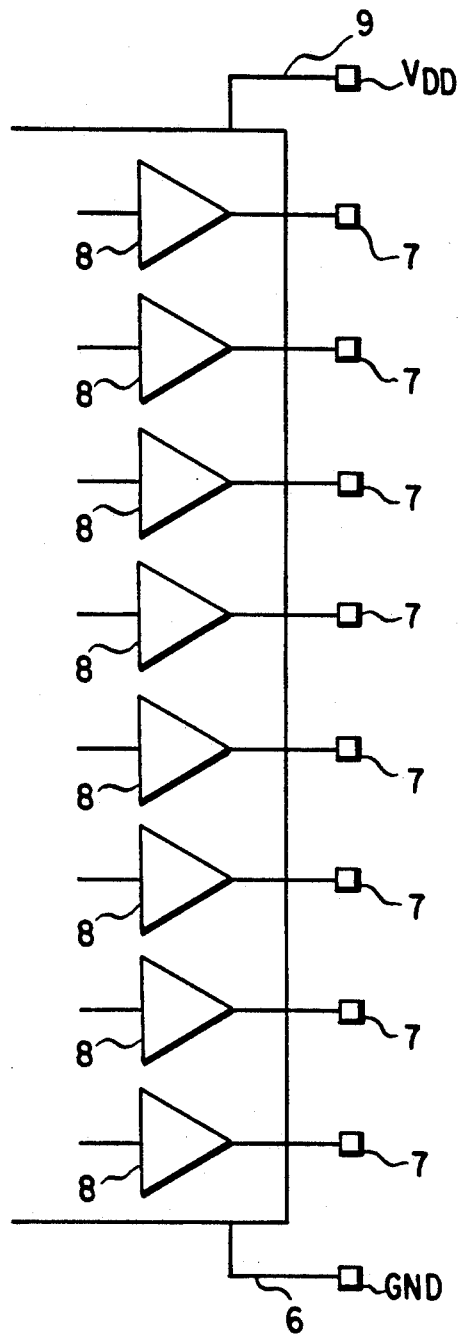
FIG. 1 is a block diagram of a plurality of conventional output circuits provided in a semiconductor integrated circuit.
Figure 2:
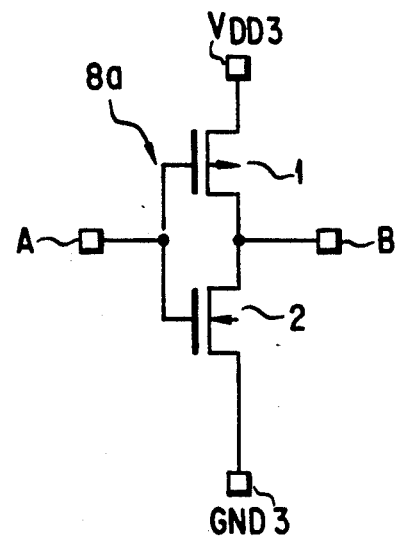
FIG. 2 is a circuit diagram showing a construction of the output circuits of FIG. 1.
Figure 3:
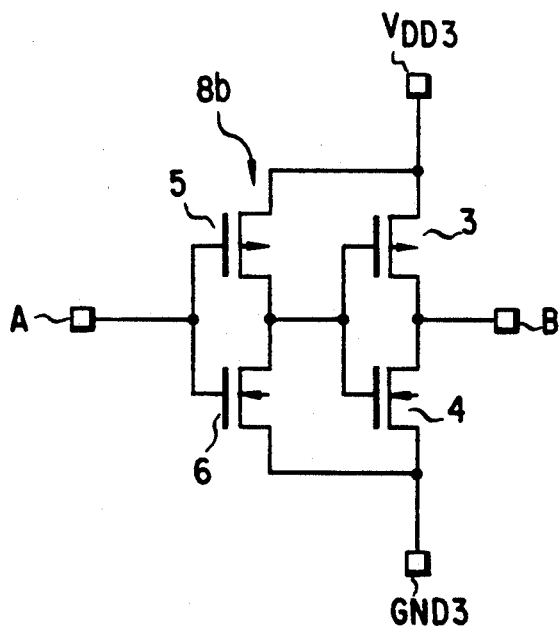
FIG. 3 is a circuit diagram showing another construction of the FIG. 1 output circuits.

Referring to the accompanying drawings, an output circuit 100 according to a first embodiment of the present invention will be explained. FIG. 4 is a circuit diagram of the output circuit 100. FIG. 5 is a timing chart for the output circuit 100 of FIG. 4.

The construction of the output circuit 100 will first be described.

The output circuit 100, which acts as an inverter, contains p-channel MOSFETs 11, 12, 21, and 22, n-channel MOSFETs 13, 14, 23, and 24, inverters 31 to 33, an input terminal A, an output terminal D, power supply terminals VDD1 and VDD2, and ground terminals GND1 and GND2.

The p-channel MOSFETs 11 and 12 and n-channel MOSFETs 13 and 14 have a large amplification factor of gm, the p-channel MOSFETs 21 and 22 and n-channel MOSFETs 23 and 24 have a small gm, and the transistors constituting the inverters 31 to 33 have a small gm.

The inverters 31 to 33, which act as delay elements, are designed so that node B may be in opposite phase with node C.

There are provided two power supply routes: VDD1–GND1 route and VDD2–GND2 route. The inverters 31 to 33 are powered by the VDD2–GND2 route. All the substrates are connected to the power supply terminal VDD2 and ground terminal GND2.

The p channel MOSFET 21 has one end of its current path connected to the power supply terminal VDD2, the other end connected to one end of the current path of the p-channel MOSFET 22, and its gate electrode connected to the input terminal A. The p-channel MOSFET 22 has the other end of its current path connected to the output terminal D, and its gate electrode connected to the output terminal of the inverter 33.

The n-channel MOSFET 23 has one end of its current path connected to the output terminal D, the other end connected to one end of the current path of the n-channel MOSFET 24, and its gate electrode connected to the output terminal of the inverter 33. The n-channel MOSFET 24 has the other end of its current path connected to the ground terminal GND2, and its gate electrode connected to the input terminal A.

The p-channel MOSFET 11 has one end of its current path connected to the power supply terminal VDD1, the other end connected to one end of the current path of the p-channel MOSFET 12, and its gate electrode connected to the input terminal A. The p-channel MOSFET 12 has the other end of its current path connected to one end of the current path of the n-channel MOSFET 13 and the output terminal D, and its gate electrode connected to the output terminal of the inverter 31.

The n-channel MOSFET 13 has the other end of its current path connected to one end of the current path of the n-channel MOSFET 14, and its gate electrode connected to the output terminal of the inverter 31. The n-channel MOSFET 14 has the other end of its current path connected to the ground terminal GND1, and its gate electrode connected to the input terminal A.

The input terminal of the inverter 33 is connected to the output terminal of the inverter 32, whose input terminal is connected to the input terminal A. The input terminal of the inverter 31 is connected to the input terminal A.

The power supply terminal VDD1 is electrically separated from the power supply terminal VDD2.

Similarly, the ground terminal GND1 is electrically separated from the ground terminal GND2.

The n-channel MOSFETs 13 and 14 are connected to the ground terminal GND1 and the n-channel MOSFET 23 and 24 are connected to the ground terminal GND2.

Referring to the timing charts of FIGS. 5A to 5D, the operation of the output circuit 100 shown in FIG. 4 will be described.

Consideration will be given to the operation when the signal supplied to the input terminal A rises from a low to a high level. First, when the input signal supplied to the input terminal A is at the low level as indicated at point a in FIG. 5A, node B is at the high level as shown in FIG. 5B and node C is at the low level as shown in FIG. 5C. In this state, the p-channel MOSFETs 21 and 22 are on, whereas the n-channel MOSFETs 23 and 24 are off. Similarly, the p-channel MOSFET 11 and n-channel MOSFET 13 are on, whereas the p-channel MOSFET 12 and n-channel MOSFET 14 are off. As a result, the output terminal D is maintained at the high level by the p-channel MOSFETs 21 and 22 and n-channel MOSFET 23 and 24, as shown in FIG. 5D.

Then, when the signal supplied to the input terminal A goes high as shown at point b in FIG. 5A, the p-channel MOSFETs 11 and 21 will turn off quickly, and at the same time, the n-channel MOSFETs 14 and 24 will turn on. The delay in the inverters 31 to 33 permits node B to remain at the high level and node C to stay at the low level, as shown in FIGS. 5B and 5C. This allows the n-channel MOSFET 13 to remain in the on state, the p-channel MOSFET 12 in the off state, the n-channel MOSFET 23 in the off state, and the p-channel MOSFET in the on state.

Because both of n-channel MOSFETs 13 and 14 are on, this causes the output signal from the output terminal D to drop to the low level as shown in FIG. 5D.

At this time, current flows from the load connected to the output terminal D through the output terminal D, and n-channel MOSFETs 13 and 14, to the ground terminal GND1, causing the potential at the ground terminal GND1 to fluctuate. The potentials at the power supply terminal VDD2 and at the ground terminal GND2, however, will not vary because the power supply terminals VDD1 and VDD2 are electrically separated from one another, and likewise, the ground terminals GND1 and GND2 are electrically separated from each other.

After the delay time of the inverters 31, 32, and 33 has elapsed, node B goes low and node C goes high as shown in FIGS. 5B and 5C. Because of this, the p-channel MOSFETs 11, 21, and 22, and the n-channel MOSFET 13 will turn off, whereas the p-channel MOSFET 12 and the n-channel MOSFETs 14, 23, and 24 will be turned on. The turning on of both the n-channel MOSFETs 23 and 24 allows the signal supplied from the output terminal D to be maintained at the low level as shown in FIG. 5D.

Because the signal supplied from the output terminal D is already at the low level as shown in FIG. 5D, the amount of current flowing from the output terminal D to the ground terminal GND2 is so small that the potential at the ground terminal GND2 scarcely changes.

This state is maintained by the p-channel MOSFETs 21 and 22 and n-channel MOSFETs 23 and 24 until the potential level of the input signal supplied to the input terminal A changes.

As explained above, when the signal supplied to the input terminal A rises from the low to the high level (during the transition), current will flow through the n-channel MOSFETs 13 and 14. In this case, the potential at the ground terminal GND1 will fluctuate. The potentials at the power supply terminal VDD2 and at the ground terminal GND2, however, will not fluctuate because the power supply terminals VDD1 and VDD2 are electrically separated from each other and the ground terminals GND1 and GND2 are electrically separated from one another. On the other hand, during the stable state, the p-channel MOSFETs 21 and 22 or the n-channel MOSFETs 23 and 24 maintain the output voltage. When the signal supplied to the input terminal A falls from the high to the low level, current will flow from the power supply terminal VDD1 through the p-channel MOSFETs 11 and 12 to the output terminal D. As a result of this, the potential at the power supply terminal VDD1 will fluctuates, but the potentials at the power supply terminal VDD2 and at the ground terminal GND2 will remain unchanged.

As described above, when the level of the signal supplied to the input terminal A changes, the potential at the output terminal D can be brought instantaneously to the low level by allowing current to flow from the load connected to the output terminal D through the output terminal D, n-channel MOSFETs 13 and 14 to the ground terminal GND1 to discharge the parasitic capacitance on the output terminal D, or can be brought instantaneously to the high level by permitting current to flow from the power supply terminal VDD1 through the p-channel MOSFETs 11 and 12 to the output terminal D to charge the output terminal D, depending on the direction of level transition.

An output circuit 200 according to a second embodiment of the present invention will be explained.

Also in the second embodiment, the power supply terminal VDD1 is electrically separated from the power supply terminal VDD2. Similarly, the ground terminal GND1 is electrically separated from the ground terminal GND2. The same holds true for a third embodiment of the present invention, which will be explained later.

FIG. 6 is a circuit diagram of the output circuit 200 of the second embodiment. FIGS. 7A to 7H are timing charts for the output circuit 200 of FIG. 6.

The configuration of an output circuit 200 shown in FIG. 6 will be explained.

The output circuit 200, which acts as a buffer, contains p-channel MOSFETs 61 and 63, n-channel MOSFETs 62 and 64, NAND circuits 41 and 51, NOR circuits 42 and 52, inverters 31 to 33, an input terminal A, an output terminal Y, power supply terminals VDD1 and VDD2, and ground terminals GND1 and GND2.

The p-channel MOSFET 63 and n-channel MOSFET 64 have a large amplification factor of gm, the p-channel MOSFET 61 and n-channel MOSFET 62 have a small gm, and the transistors constituting the inverters 31 to 33, NAND circuits 41 and 51, and NOR circuits 42 and 52 have a small gm.

The inverters 31 to 33, which act as delay elements, are designed so that node B may be in opposite phase with node E.

There are provided two power supply routes: VDD1-GND1 route and VDD2-GND2 route. The NAND circuits 41 and 51, NOR circuits 42 and 52, and inverters 31 to 33 are powered by the VDD2-GND2 route. All the substrates are connected to the power supply terminal VDD2 and ground terminal GND2.

The p-channel MOSFET 61 has one end of its current path connected to the power supply terminal VDD2, the other end connected to the output terminal Y, and its gate electrode connected to the output terminal of the NAND circuit 51. The n-channel MOSFET 62 has one end of its current path connected to the output terminal Y, the other end connected to the ground terminal GND2, and its gate electrode connected to the output terminal of the NOR circuit 52.

The NAND circuit 51 has its first input terminal connected to the input terminal A and its second input terminal connected to the output terminal of the inverter 33. The NOR circuit 52 has its first input terminal connected to the output terminal of the inverter 33 and its second input terminal connected to the input terminal A.

The input terminal of the inverter 33 is connected to the output terminal of the inverter 32, whose input terminal is connected to the input terminal A.

The p-channel MOSFET 63 has one end of its current path connected to the power supply terminal VDD1, the other end connected to one end of the current path of the n-channel MOSFET 64 and the output terminal Y, and its gate electrode connected to the output terminal of the NAND circuit 41. The n-channel MOSFET 64 has the other end of its current path connected to the ground terminal GND1, and its gate electrode connected to the output terminal of the NOR circuit 42.

The NAND circuit 41 has its first input terminal connected to the input terminal A. The inverter 31 has its input terminal connected to the output terminal A and its output terminal connected to a second input terminal of the NAND circuit 41 and a first input terminal of the NOR circuit 42, whose second input terminal is connected to the input terminal A.

Referring to the timing charts shown in FIGS. 7A to 7H, the operation of the output circuit 200 of FIG. 6 will be described.

Figure 7:
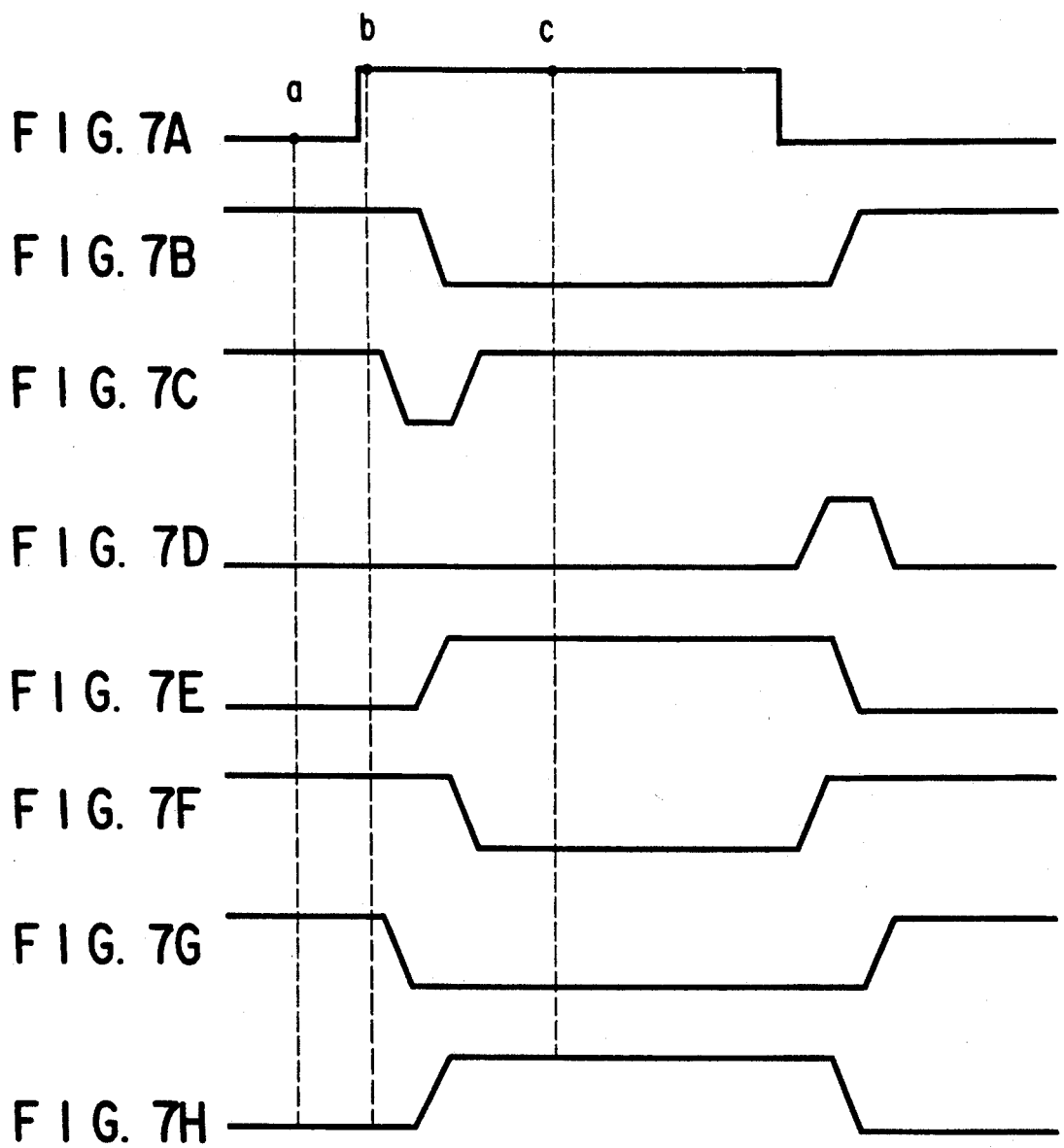
FIGS. 7A to 7H are a timing chart for explaining the operation of the output circuit of the second embodiment.

Consideration will be given to the operation when the signal supplied to the input terminal A rises from the low to the high level. When the signal supplied to the input terminal A is at the low level indicated at point a in FIG. 7A, the NAND circuit 51 has its first input terminal supplied with a low level signal and its second input terminal also supplied with a low level signal via the inverters 32 and 33 as shown in FIG. 7E. As a result, the NAND circuit 51 supplies a high level signal to the gate electrode of the p-channel MOSFET 61 as shown in FIG. 7F. Receiving the high level signal, the p-channel MOSFET 61 is off.

The NOR circuit 52 has its first input terminal supplied with the low level signal from the inverter 33, and its second input terminal supplied with the low level signal from the input terminal A. This allows the NOR circuit 52 to supply a high level signal as shown in FIG. 7G to the gate electrode of the n-channel MOSFET 62. In consequence, the n-channel MOSFET 62 is turned on.

The NAND circuit 41 has its first input terminal supplied with a low level signal and its second input terminal supplied with the high level signal from the inverter 31 as shown in FIG. 7B, which permits the NAND circuit 41 to supply a high level signal as shown in FIG. 7C to the gate electrode of the p-channel MOSFET 63. As a result, the p-channel MOSFET 63 is turned off.

The NOR circuit 42 has its first input terminal supplied with the high level signal from the inverter 31 as shown in FIG. 7B, and its second input terminal supplied with a low level signal. This allows the NOR circuit 42 to supply a low level signal as shown in FIG. 7D to the gate electrode of the n-channel MOSFET 64. In consequence, the n-channel MOSFET 64 is turned off.

Therefore, the p-channel MOSFETs 61 and 63 and n-channel MOSFET 64 are off, and the n-channel MOSFET 62 is turned on, which allows the signal supplied from the output terminal Y to be maintained at the low level as shown in FIG. 7H.

Immediately after the signal supplied to the input terminal A has gone high (indicated at point b in FIG. 7A), the inverters 32 and 33 delay the signal, so that node E maintains the low level as shown in FIG. 7E. This allows the NAND circuit 51 to have its first input terminal supplied with the high level signal and its second input terminal supplied with the low level signal, which enables the NAND circuit 51 to supply the high level signal as shown in FIG. 7F to the gate electrode of the p-channel MOSFET 61. As a result, the p-channel MOSFET 61 remains off.

The NOR circuit 52 has its first input terminal supplied with the low level signal from the inverter 33 and its second input terminal supplied with the high level signal. As a result, the NOR circuit 52 supplies a low level signal as shown in FIG. 7G to the gate electrode of the n-channel MOSFET 62. This permits the n-channel MOSFET 62 to turn off.

The NAND circuit 41 has its first input terminal supplied with the high level signal from the input terminal A and its second input terminal supplied with the high level signal from the inverter 31, which allows the NAND circuit 41 to supply a low level signal as shown in FIG. 7C to the gate electrode of the p-channel MOSFET 63. In consequence, the p-channel MOSFET 63 is turned on.

The NOR circuit 42 has its first input terminal supplied with the high level signal as shown in FIG. 7B from the inverter 31 and its second input terminal supplied with the high level signal from the input terminal A, which allows the NOR circuit 42 to supply a low level signal as shown in FIG. 7D to the gate electrode of the n-channel MOSFET 64. In consequence, the n-channel MOSFET 64 remains off.

As noted above, because the p-channel MOSFET 61 and n-channel MOSFETs 62 and 64 are turned off and the p-channel MOSFET 63 is turned on, when the level of the signal supplied to the input terminal A changes from the low to the high level, current flows, simultaneously with the level change, from the power supply terminal VDD1 through the p-channel MOSFET 63 to the output terminal Y to charge the output terminal Y, with the result that the potential of the output terminal Y rises instantaneously. That is, the level at the output terminal Y changes instantaneously, following the level change at the input terminal A.

At this time, a large current flows from the power supply terminal VDD1 to the output terminal Y. The potentials at the power supply terminal VDD2 and at the ground terminal GND2 remain unchanged because the power supply terminals VDD1 and VDD2 are electrically separated from one another, and the ground terminals GND1 and GND2 are electrically separated from each other.

After the delay time of the inverters 31, 32, and 33 has elapsed, the output signal from the inverter 31 goes low as shown in FIG. 7B, and the output signal from the inverter 33 goes high as shown in FIG. 7E. As a result, the output signal from the NAND circuit 41 goes high as shown in FIG. 7C, causing the p-channel MOSFET 63 to turn off. The output signal from the NAND circuit 51 goes low, causing the p-channel MOSFET 61 to turn on.

At this time, current flows from the power supply terminal VDD2 to the output terminal Y, but the potential of the power supply terminal remains unchanged because the output terminal Y is already charged with the current from the power supply terminal VDD1.

After that, the signal from the output terminal Y is kept at the high level by the p-channel MOSFET 61 and n-channel MOSFET 62 as shown in FIG. 7H until the potential of the signal supplied to the input terminal A changes.

When the level of the input signal supplied to the input terminal A changes from the low to the high level as shown in FIG. 7A, the p-channel MOSFETs 63 and 61, and n-channel MOSFET 62 are off, and the n-channel MOSFET 64 is on, with the result that the parasitic capacitance on the output terminal Y is discharged from the output terminal Y through the n-channel MOSFET 64 to the ground terminal GND1. This allows the potential at the output terminal Y to change to the low level instantaneously.

At this time, the potential at the ground terminal GND1 fluctuates, but the potential at the ground terminal GND2 remains unchanged.

An output circuit 300 according to a third embodiment of the present invention will be explained. The output circuit 300 is a modification of the output circuit 200 of FIG. 6.

Figures 8, 10:
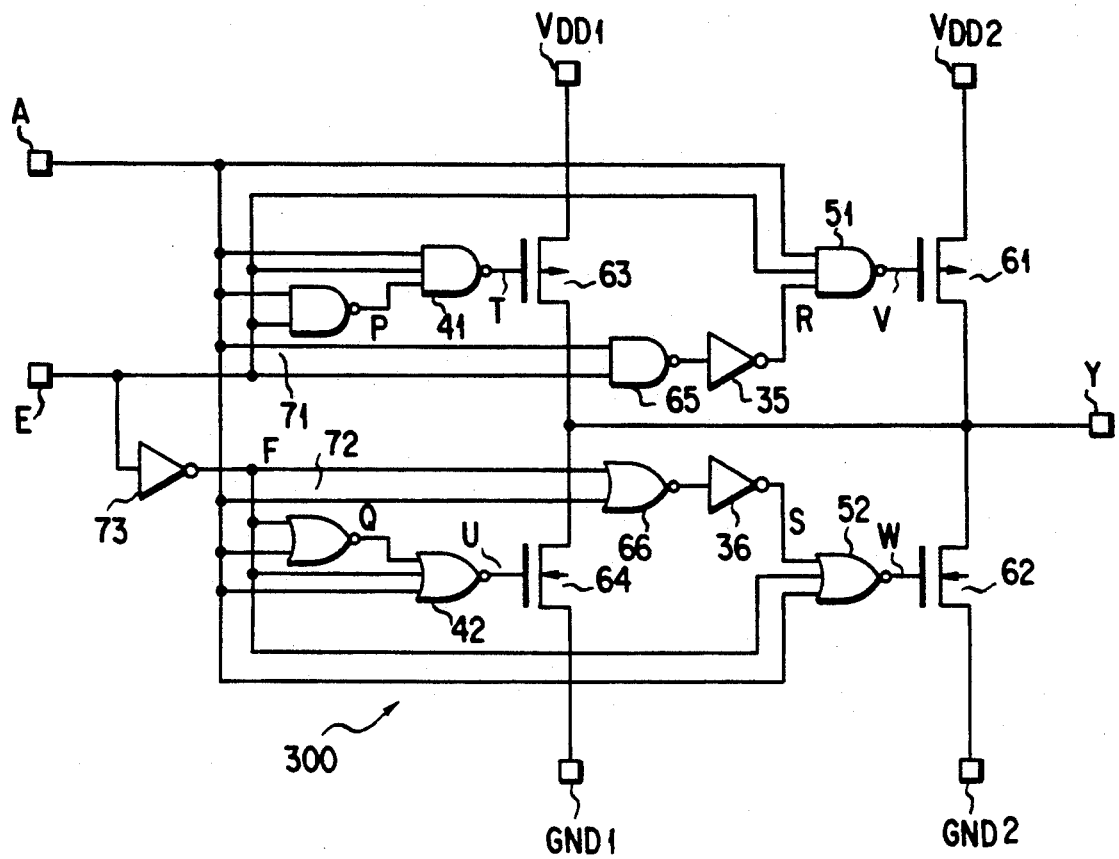
FIG. 8 is a circuit diagram of an output circuit according to a third embodiment of the present invention.
FIG. 10 is a truth table that lists the logic levels at the input, output, and control terminals.

FIG. 8 is a circuit diagram of the output circuit 300 of the third embodiment. FIGS. 9A to 9Y are the timing charts for the output circuit 300 of FIG. 8. FIG. 10 is a truth table listing the potentials of the output signal in the stable state of the FIG. 8 output circuit 300.

The configuration of the FIG. 8 output circuit 300 will be described.

The output circuit 300, which acts as a try state buffer, has its output terminal Y provide a high level signal or be in a high impedance state when a low level signal is supplied to its control terminal E.

The output circuit 300 of FIG. 8 contains p-channel MOSFETs 61 and 63, n-channel MOSFETs 62 and 64, NAND circuits 51, 65, 41 and 71, NOR circuits 52, 66, 42, and 72, inverters 35, 36, and 73, an input terminal A, a control terminal E, an output terminal Y, power supply terminals VDD1 and VDD2, and ground terminals GND1 and GND2.

The p-channel MOSFETs 63 and n-channel MOSFET 64 have a large amplification factor of gm, the p-channel MOSFET 61 and n-channel MOSFET 62 have a small gm, and the transistors constituting the inverters 35, 36, to 73, NAND circuits 71, 65, 41, and 51, and NOR circuits 72, 66, 42, and 52 have a small gm.

The inverters 35 and 36, the NAND circuits 71 and 65, and the NOR circuits 72 and 66, which act as delay elements, are designed so that their delays between the input terminals A and E and nodes P, Q, R, and S may all be equal.

There are provided two power supply routes: VDD1-GND1 route and VDD2-GND2 route. The inverters 35, 36, and 73, NAND circuits 71, 65, 41, and 51, NOR circuits 72, 66, 42, and 52 are powered by the VDD2-GND2 route. All the substrates are connected to the power supply terminal VDD2 and ground terminal GND2.

The p-channel MOSFET 61 has one end of its current path connected to the power supply terminal VDD2, the other end connected to the output terminal Y, and its gate electrode connected to the output terminal of the NAND circuit 51.

The NAND circuit 51 has its first input terminal connected to the input terminal A, its second input terminal connected to the control terminal E, and its third input terminal connected to the output terminal of the inverter 35. The input terminal of the inverter 35 is connected to the output terminal of the NAND circuit 65. The NAND circuit 65 has its first input terminal connected to the input terminal A and its second input terminal connected to the control terminal E.

The p-channel MOSFET 63 has one end of its current path connected to the power supply terminal VDD1, the other end connected to the output terminal Y and one end of the current path of the n-channel MOSFET 64, and its gate electrode connected to the output terminal of the NAND circuit 41.

The NAND circuit 41 has its first input terminal connected to the input terminal A, its second input terminal connected to the control terminal E, and its third input terminal connected to the output terminal of the NAND circuit 71. The NAND circuit 71 has its first input terminal connected to the input terminal A, and its second input terminal connected to the control terminal E.

The n-channel MOSFET 62 has one end of its current path connected to the output terminal Y, the other end connected to the ground terminal GND2, and its gate electrode connected to the output terminal of the NOR circuit 52.

The NOR circuit 52 has its first input terminal connected to the output terminal of the inverter 36, its second input terminal connected to the output terminal of the inverter 73, and its third input terminal connected to the input terminal A.

The input terminal of the inverter 36 is connected to the output terminal of the NOR circuit 66. The NOR circuit 66 has its first input terminal connected to the output terminal of the inverter 73, and its second input terminal connected to the input terminal A.

The n-channel MOSFET 64 has one end of its current path connected to the output terminal Y, the other end connected to the ground terminal GND1, and its gate electrode connected to the output terminal of the NOR circuit 42.

The NOR circuit 42 has its first input terminal connected to the output terminal of the NOR circuit 72, its second input terminal connected to the output terminal of the inverter 73, and its third input terminal connected to the input terminal A.

The NOR circuit 72 has its first input terminal connected to the output terminal of the NOR circuit 73, and its second input terminal connected to the input terminal A. The input terminal of the inverter 73 is connected to the control terminal E.

An explanation will be given of the truth table shown in FIG. 10. The letter A indicates the input terminal A shown in FIG. 8; E denotes the control terminal E; and Y represents the output terminal Y. The letter H indicates a high level, L a low level, HZ a high impedance state, and X an undefined state.

The operation of the output circuit 300 will be explained, referring to the truth table of FIG. 10. First, an explanation will be given of a case where a low level signal is supplied to the input terminal A as shown at point a in FIG. 9A and a high level signal is supplied to the control terminal E as shown in FIG. 9E. In this case, the output signal from the NAND circuit 51 is at the high level as shown in FIG. 9V, causing the p-channel MOSFET 61 to turn off. The output signal of the NOR circuit 52 is at the high level as shown in FIG. 9W, causing the n-channel MOSFET 62 to turn on.

The output signal from the NAND circuit 41 is at the high level as shown in FIG. 9T, making the p-channel MOSFET 63 off. The output signal of the NOR circuit 42 is at the low level as shown in FIG. 9U, making the n-channel MOSFET 64 off.

With the p-channel MOSFET 61 off, the n-channel MOSFET 62 on, and the p-channel MOSFET 63 and n-channel MOSFET 64 off, the signal supplied from the output terminal Y is at the low level.

Next, an explanation will be given of a case where a high level signal is supplied to the control terminal E as shown at point b in FIG. 9A, and the signal changes from the low to the high level as shown in FIG. 9A. Immediately after the change, nodes P, Q, R, and S remain at the high, the high, the low, and the low level, respectively, because of the delays in the NAND circuit 71, NOR circuit 72, NAND circuit 65, inverter 35, NOR circuit 66, and inverter 36.

With the p-channel MOSFET 61 off, the n-channel MOSFET 62 off, the p-channel MOSFET 63 on, and the n-channel MOSFET 64 off, current flows from the power supply terminal VDD1 through the p-channel MOSFET 63 to the input terminal Y without affecting the power supply terminal VDD2 and the ground terminal GND2.

After the delay time of the NAND circuit 71, NOR circuit 72, NAND circuit 65, inverter 35, NOR circuit 66, and inverter 36 has elapsed, nodes P, Q, R, and S are brought to the low, the low, the high, and the high level, respectively. This causes the output signal of the NAND circuit 51 to go low as shown in FIG. 9V, turning the p-channel MOSFET 61 on. In addition, the output signal of the NOR circuit 52 is placed at the low level as shown in FIG. 9W, causing the n-channel MOSFET 62 to turn off.

The output signal of the NAND circuit 41 is at the high level as shown in FIG. 9T, causing the p-channel MOSFET 63 to be off. The output signal of the NOR circuit 42 is at the low level as shown in FIG. 9U, making the n-channel MOSFET 64 off. With the p-channel MOSFET 61 on, the n-channel MOSFET 62 off, and the p-channel MOSFET 63 and n-channel MOSFET 64 off, the output signal from the output terminal Y is already at the high level, which prevents the potential at the power supply terminal VDD2 from changing noticeably. This output state is maintained by the p-channel MOSFET 61 and n-channel MOSFET 62 until the potential changes again. In this state, when the low level signal is supplied to the control terminal E, all the transistors are off as shown in FIGS. 9P, 9T, 9R, 9Q, 9U, 9S, 9V, and 9W, which brings nodes P, T, R, Q, U, S, V, and W of the output circuit 300 to a high impedance state.

As described above, even with the FIG. 8 configuration of the output circuit 300, the potentials at the power supply terminal VDD2 and at the ground terminal GND2 will remain unchanged, although the potential between the power supply terminal VDD1 and the ground terminal GND1 fluctuates. Therefore, there is no adverse effect of switching noises created during the transition of the input signal potential in the output circuit 300.

The above configuration minimizes the effect of switching noises caused during the transition of the input signal potential in the output circuit. This enables the adjacent output circuits in the stable state to avoid the effect of noises created in another output circuit that is in transition.

Output circuits of the present invention can operate at high speeds because there is no need to turn on their output transistors at lower speeds.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. An output circuit comprising:
    an input terminal for receiving an input signal at a predetermined logic level;
    an output terminal held at a potential corresponding to the logic level of said input signal;
    first and second power sources separated from each other;
    third and fourth power sources separated from each other;
    fast potential changing means connected between said first and third power sources, for instantaneously changing the potential of said output terminal when the logic level of said input signal changes;
    potential maintaining means connected between said second and fourth power sources, for maintaining the potential of said output terminal at the same level after the potential is changed by said rapid potential changing means;
    first controlling means for controlling said fast potential changing means such that said fast potential changing means starts operating when the logic level of said input signal changes, and stop operating when a predetermined time of period elapses; and
    second controlling means for controlling said potential maintaining means such that said potential maintaining means starts operating after said fast potential changing means starts operating.

2. An output circuit according to claim 1, wherein said first and second controlling means are first and second delay circuits, respectively.

3. An output circuit according to claim 2, wherein said first and second delay circuits are composed of inverting means.

4. An output circuit according to claim 2, wherein said first delay circuit has a delay time shorter than that of said second delay circuit.

5. An output circuit according to claim 1, wherein said fast potential changing means includes first and second MOS transistors of a first conductivity type connected in series and third and fourth MOS transistors of a second conductivity type connected in series, gates of the first and fourth MOS transistors are connected to said input terminal, gates of the second and third MOS transistors are connected to said first controlling means, first and second paths of the first and the second MOS transistors are connected to said first and third power sources, respectively, and a node of the second and third MOS transistors is connected to said output terminal.

6. An output circuit according to claim 1, wherein said potential maintaining means includes fifth and sixth MOS transistors of the first conductivity type connected in series and seventh and eighth MOS transistors of the second conductivity type connected in series, gates of the fifth and eighth MOS transistors are connected to said input terminal, gates of the sixth and seventh MOS transistors are connected to said second controlling means, first and second paths of the fifth and the eighth MOS transistors are connected to said second and fourth power sources, respectively, and a node of the second and third MOS transistors is connected to said output terminal.

7. An output circuit according to claim 1, wherein said first and second controlling means ar first and second delay circuits, respectively.

8. An output circuit according to claim 1, wherein said first controlling means is composed of a first delay circuit, a first NAND gate and a first NOR gate, and said second controlling means is composed of a second delay circuit, a second NAND gate and a second NOR gate.

9. An output circuit according to claim 8, wherein said first and second delay circuits are composed of inverting means.

10. An output circuit according to claim 8, wherein said first delay circuit has a delay time is shorter than that of said second delay circuit.

11. An output circuit according to claim 1, wherein said fast potential changing means includes a first MOS transistor of a first conductivity type and a second MOS transistor of a second conductivity type connected in series with each other, the gates of which are connected to output nodes of said first NAND gate and said first NOR gate, respectively, one end current path of the first MOS transistor is connected to said first power source, one end current path of the second MOS transistor is connected to said third power source, and a node of said first and second MOS transistors is connected to said output terminal.

12. An output circuit according to claim 1, wherein said potential maintaining means includes a third MOS transistor of the first conductivity type and a fourth MOS transistor of the second conductivity type connected in series with each other, the gates of which are connected to output nodes of said second NAND gate and said second NOR gate, respectively, one end current path of the third MOS transistor is connected to said second power source, one end current path of the fourth MOS transistor is connected to said fourth power source, and a node of said third and fourth MOS transistors is to said output terminal.

13. An output circuit, comprising:
 an input terminal for receiving an input signal at a predetermined logic level;
 an output terminal held at a potential corresponding to the logic level of said input signal;
 first and second power sources separated from each other;
 third and fourth power sources separated from each other;
 fast parasitic capacitance amount changing means connected between said first and third power sources, for instantaneously changing parasitic capacitance at said output terminal when a logic level of said input signal changes;
 potential maintaining means connected between said second and fourth power sources, for maintaining the potential of said output terminal at the same level after the potential is changed by said fast parasitic capacitance amount changing means;
 first controlling means for controlling said fast parasitic capacitance amount changing means such that said fast parasitic capacitance amount changing means starts operating when the logic level of said input signal changes and stops operating after a predetermined time of period elapses; and
 second controlling means for controlling said potential maintaining means such that said potential maintaining means starts operating after said fast parasitic capacitance amount changing means starts operating.

14. An output circuit according to claim 13, wherein said first and second controlling means are first and second delay circuits, respectively.

15. An output circuit according to claim 14, wherein said first and second delay circuits are composed of inverting means.

16. An output circuit according to claim 14, wherein said first delay circuit has a delay time shorter than that of said second delay circuit.

17. An output circuit according to claim 13, wherein said fast parasitic capacitance amount changing means includes first and second MOS transistors of a first conductivity type connected in series and third and fourth MOS transistors of a second conductivity type connected in series, gates of the first and fourth MOS transistors are connected to said input terminal, gates of the second and third MOS transistors are connected to said first controlling means, first and second paths of the first and the second MOS transistors are connected to said first and third power sources, respectively, and a node of the second and third MOS transistors is connected to said output terminal.

18. An output circuit according to claim 13, wherein said potential maintaining means includes fifth and sixth MOS transistors of a first conductivity type connected in series and seventh and eighth MOS transistors of a second conductivity type connected in series, gates of the fifth and eighth MOS transistors are connected to said input terminal, gates of the sixth and seventh MOS transistors are connected to said second controlling means, first and second of the fifth and the eighth MOS transistors are connected to said second and fourth power sources, respectively, and a node of the second and third MOS transistors are connected to said output terminal.

19. An output circuit according to claim 13, wherein said first and second controlling means are first and second delay circuits, respectively.

20. An output circuit according to claim 13, wherein said first controlling means is composed of a first delay circuit, a first NAND gate and a first NOR gate, and said second controlling means is composed of a second delay circuit, a second NAND gate and a second NOR gate.

21. An output circuit according to claim 18, wherein said first and second delay circuits are composed of inverting means.

22. An output circuit according to claim 18, wherein said first delay circuit has a delay time shorter than that of said second delay circuit.

23. An output circuit according to claim 13, wherein said fast parasitic capacitance amount changing means includes a first MOS transistor of the first conductivity type and a second MOS transistor of the second conductivity type connected in series with each other, gates of which are connected to output nodes of said first NAND gate and said first NOR gate, respectively, one end current path of the first MOS transistor is connected to said first power source, one end current path of the second MOS transistor is connected to said third power source, and a node of said first and second MOS transistors are connected to said output terminal.

24. An output circuit according to claim 13, wherein said potential maintaining means includes a third MOS transistor of the first conductivity type and a fourth MOS transistor of the second conductivity type connected in series with each other, the gates of which are connected to output nodes of said second NAND gate and said second NOR gate, respectively, one end current path of the third MOS transistor is connected to said second power source, one end current path of the fourth MOS transistor is connected to said fourth power source, and a node of said third and fourth MOS transistors are said output terminal.

* * * * *